United States Patent [19]

Lur et al.

[11] Patent Number: 5,466,632
[45] Date of Patent: Nov. 14, 1995

[54] FIELD OXIDE WITH CURVILINEAR BOUNDARIES AND METHOD OF PRODUCING THE SAME

[75] Inventors: Water Lur, Taipei; Jiun Y. Wu, Yun-Lin Hsien, both of Taiwan

[73] Assignee: United Microelectronics Corp., Hsinchu City, Taiwan

[21] Appl. No.: 249,632

[22] Filed: May 26, 1994

[51] Int. Cl.$^6$ ............................................. H01L 21/76
[52] U.S. Cl. .................. 437/69; 437/70; 148/DIG. 106
[58] Field of Search ................................. 437/69, 70, 72, 437/73

[56] References Cited

FOREIGN PATENT DOCUMENTS 0016547  4/1987  Japan ........................................ 437/72

OTHER PUBLICATIONS

Wolf, "Silicon Processing For The VLSI Era" vol. 2, Process Integration; Lattice Press, pp. 20–22, 1990.

Primary Examiner—Brian E. Hearn
Assistant Examiner—Trung Dang
Attorney, Agent, or Firm—Ladas & Parry

[57] ABSTRACT

A method of forming field oxides with curvilinear boundaries between active regions on a substrate in an integrated circuit (IC) so that the stresses induced in the active regions due to the formation of field oxide can be reduced. Problems like junction leakage are reduced due to the rounded boundaries of the field oxides.

5 Claims, 4 Drawing Sheets

FIELD OXIDE WITH CURVILINEAR BOUNDARIES AND METHOD OF PRODUCING THE SAME

FIELD OF THE INVENTION

The present invention relates to a field oxide structure in an integrated circuit (IC), especially to a field oxide structure with curvilinear boundaries to reduce stresses induced around the boundaries.

BACKGROUND OF THE INVENTION

Conventional processes to form field oxides are shown in FIGS. 1 and 2. FIG. 1 shows a substrate 1 and two active regions 12 thereon. As shown in FIG. 2, pad oxides 14 are formed on the active regions 12, then nitrides 16 are formed on the pad oxides 14 as shields. After that, the substrate 1 is thermally oxidized to grow field oxides 10.

In conventional methods of forming the field oxides, the boundaries of the active regions 12 and nitrides 16 are straight. After oxidization, bird beaks 18 are formed between the active regions 12 and the field oxides 10. As a result, there are large stress induced by the bird beaks 18 in the active regions. Such stress results in crystalline defects which cause problems like junction leakage.

SUMMARY OF THE INVENTION

The object of the present invention is to provide a structure of field oxides and a method for forming such field oxides which reduce stress induced in active regions.

The above objects are fulfilled by providing a structure of a field oxide and a method of forming a curvilinear field oxide. The structure comprises a field oxide formed between two active regions on a substrate with curvilinear boundaries. The method comprises the following steps: (a) forming shields with stepped or curvilinear boundaries on said active regions; and (b) oxidizing said substrate.

BRIEF DESCRIPTION OF THE DRAWING

The present invention will become more fully understood from the detailed description given hereinafter and with reference to the accompanying drawings which are given by way of illustration only, and thus are not limitative of the present invention and wherein.

Figure 1:
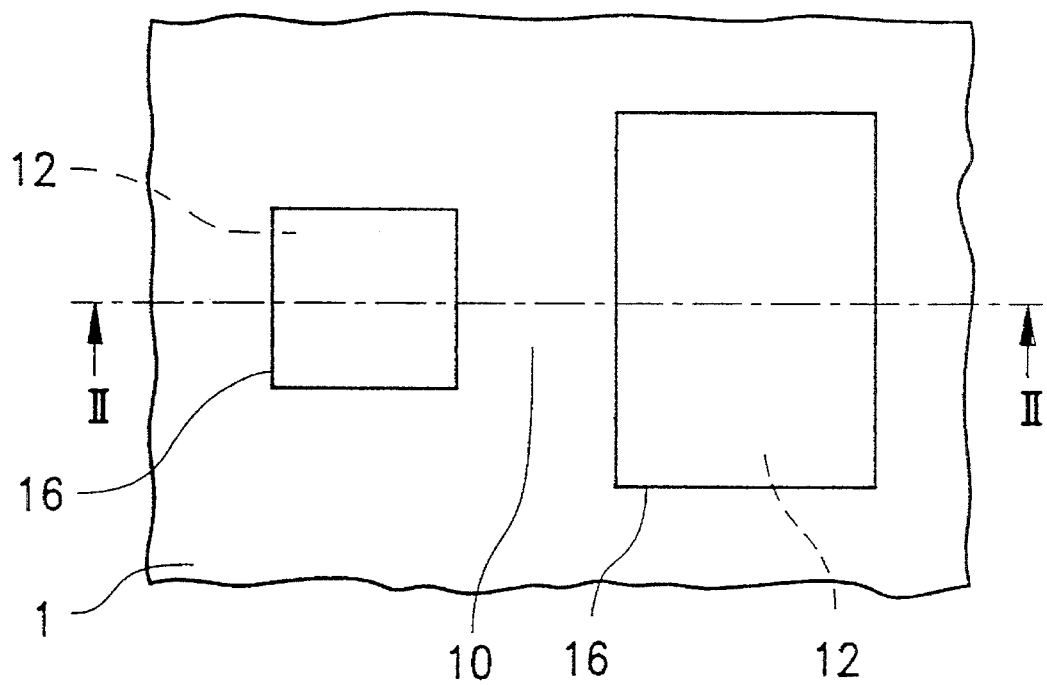
FIG. 1 is a top view showing conventional field oxides and two active regions.
Figure 2:
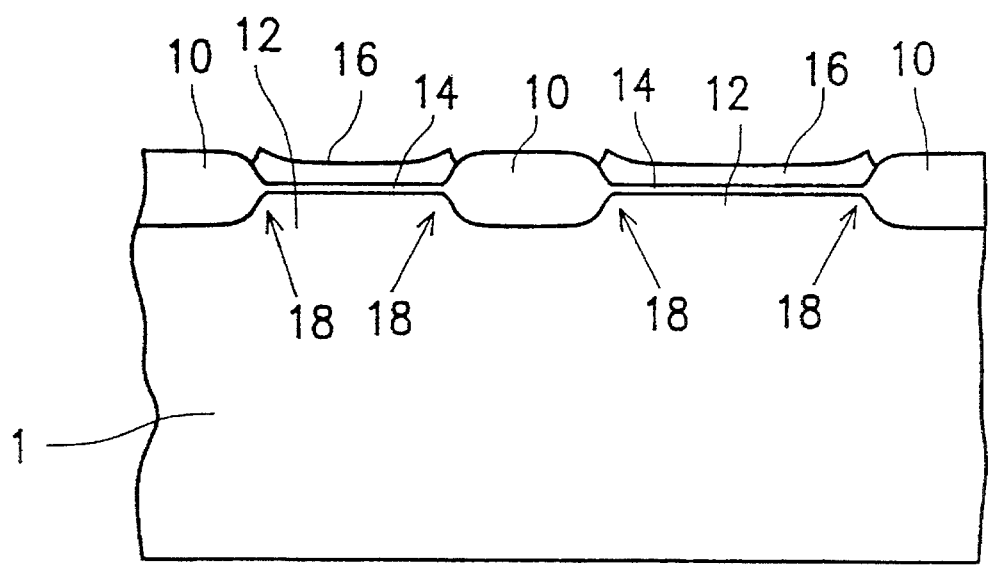
Figure 3A:
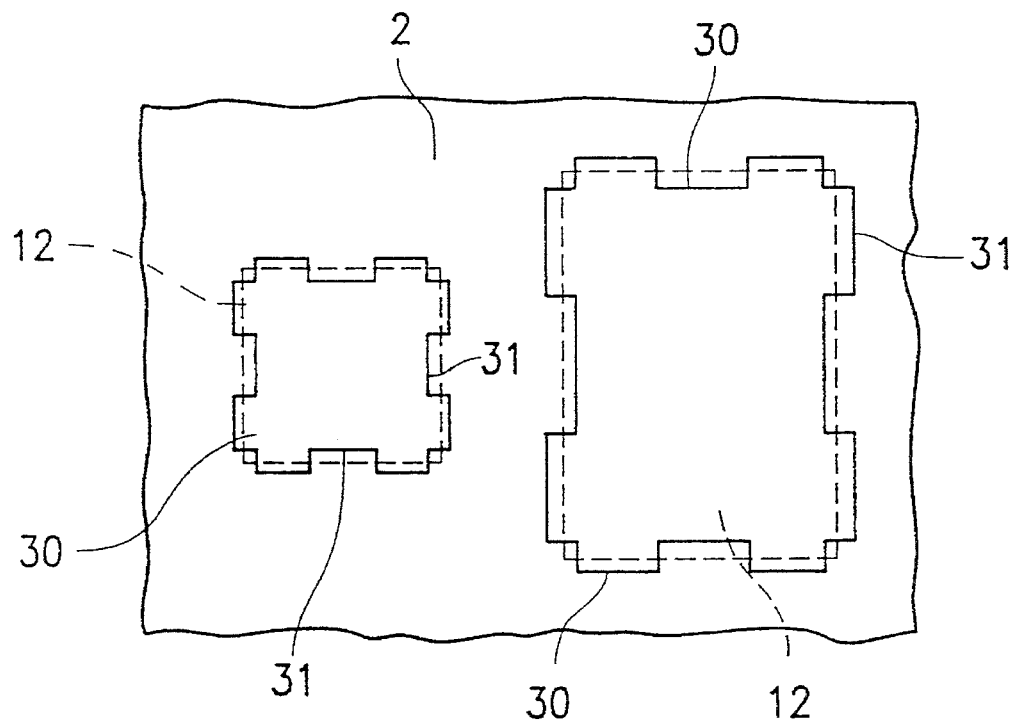
Figure 3B:
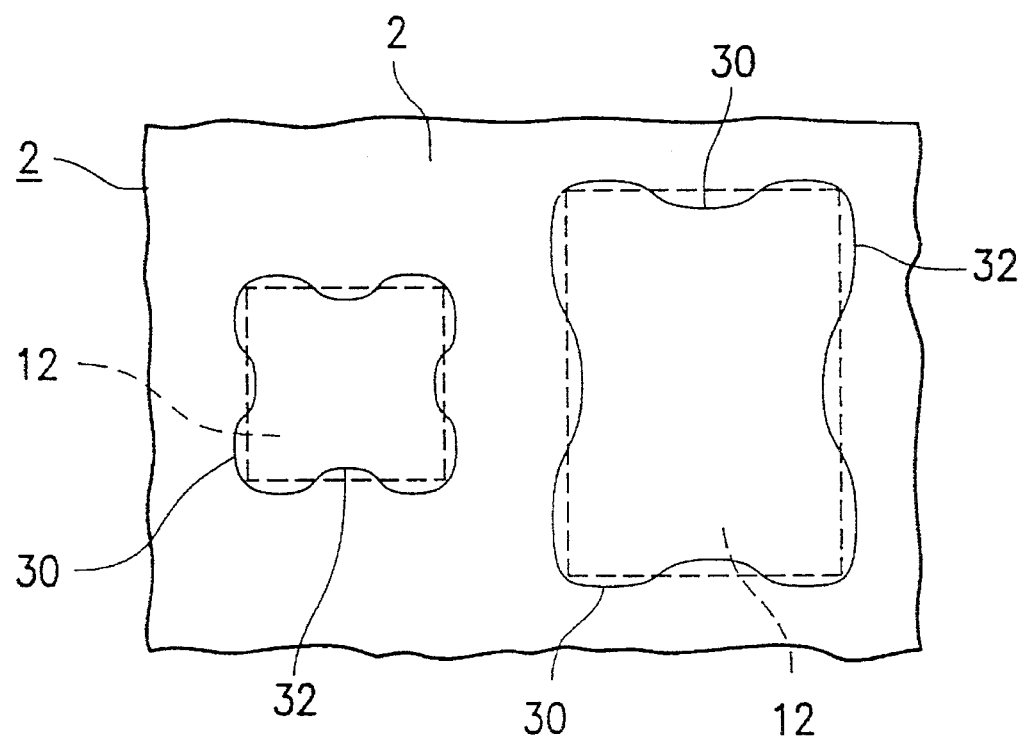
Figure 6:
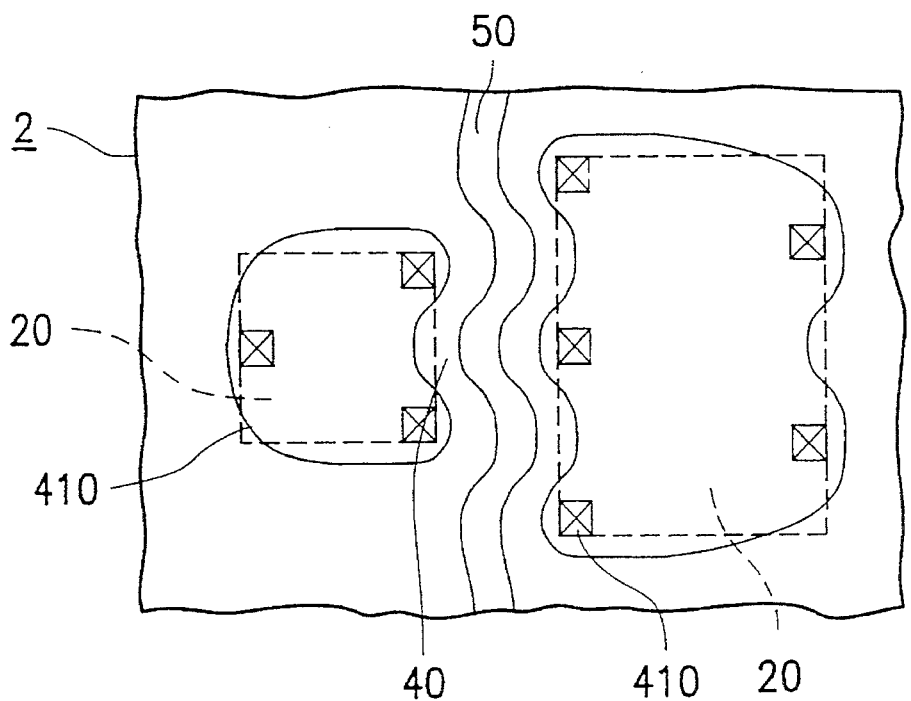

Fig, 2 is a cross-sectional view taken from line II—II in FIG. 1;

Fig, 3a is a top view showing shields with stepped boundaries used in a first embodiment of the present invention;

FIG. 3b is a top view showing shields with curvilinear boundaries used in a first embodiment of the present invention;

Fig, 4 is a top view .showing the first embodiment of curvilinear field oxides according to the present invention;

Fig, 5 is a top view showing a second embodiment of curvilinear field oxides according to the present invention; and FIG. 6 is a top view showing a third embodiment of curvilinear field oxides according to the present invention,

DETAILED DESCRIPTION OF THE PREFERRED EMBODIMENT

Figure 4:
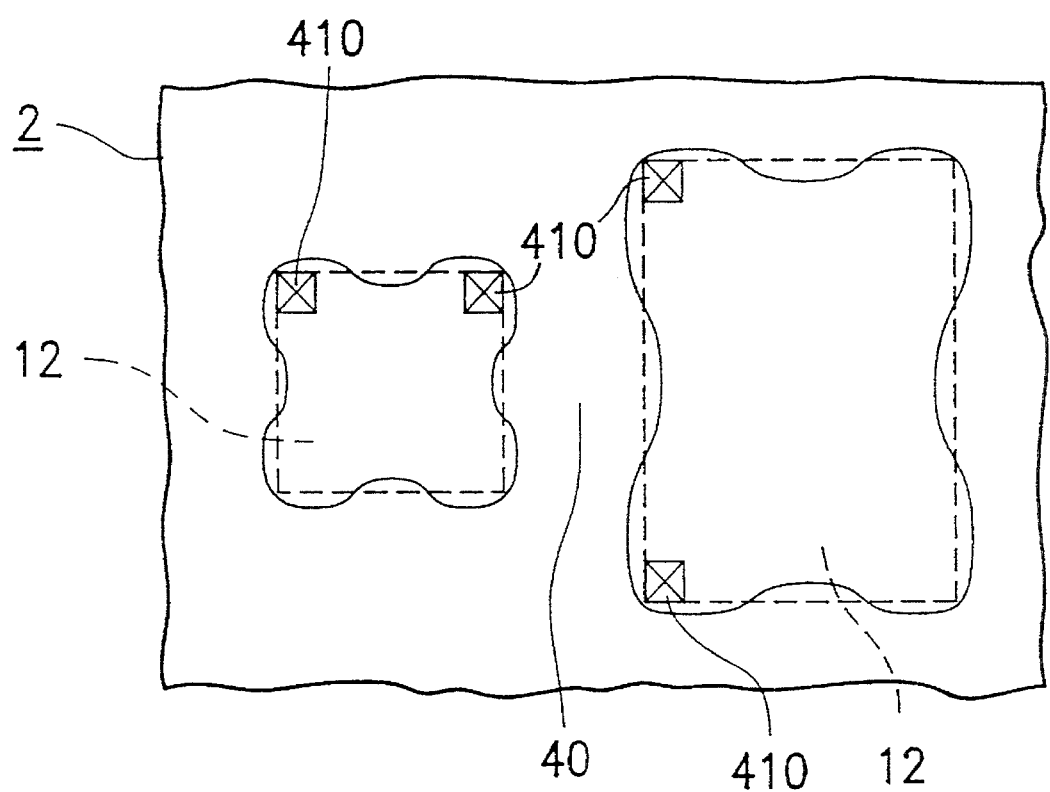

A first embodiment of the method of forming a curvilinear field oxide according to the present invention is shown in FIGS. 3a, 3b and 4. At first, shields 30 are formed on active regions 12 on a substrate 2. The boundaries 31 of the shields 30 are preferably patterned jaggedly or in a stepped fashion as shown in FIG. 3a. The boundaries in the embodiment of FIG. 3a comprise a plurality of relatively short generally linear portions (the portions do not need to be linear, i.e., the portions may be curvilinear or comprise a mixture of generally linear and curvilinear portions) which are offset one from another to form the stepped or jagged configuration shown in FIG. 3a. The boundaries 31 can be formed by conventional techniques, e. g. forming a pad oxide and a nitride layer on the substrate 2 and then patterning the oxide/nitride layer using conventional lithography techniques. After that, a field oxide 40 is formed on the substrate 2 between the active regions 12. This can be done by, for example, thermally oxidizing the substrate 2 so that the field oxide 40 grows thereon where not shielded. Due to the stepped boundaries 31 of the shields 30 and the rounding effect of field oxides, the boundaries of the field oxide 40 are rounded and curvilinear as shown in FIG. 4. With the boundaries of field oxide 40 being rounded rather than straight as in the prior art, it appears that the stresses which are induced in active regions 12 are reduced. It is believed that less defects are generated in active regions 12 and the result appears to be a reduction in junction leakage and other problems evidenced when making use of structures formed by the method of the prior art. Therefore, problems like junction leakage that are caused by lattice defects can be reduced. Contacts 410 can be formed at the corners of the active regions 12.

Instead of using shields with stepped or jagged boundaries 31, the shields 30 may alternatively have curvilinear boundaries 32, as shown in FIG. 3b. The resulting field oxide 40, after it is formed, still has the desired curvilinear boundaries shown in FIG. 4.

Figure 5:
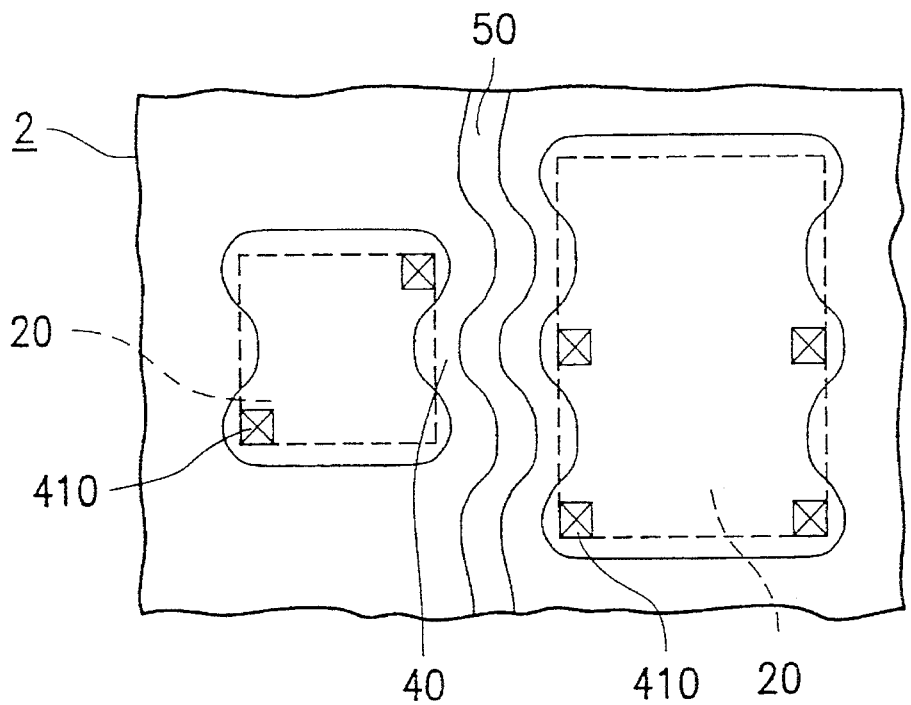

As shown in FIG. 4, contacts 410 can be arranged at the corners of the active regions 12. FIGS. 5 and 6 further show two embodiments in which the boundaries of adjacent active regions form a path with an essentially constant width. A conductive ribbon 50, made of polysilicon, tungsten, aluminum, etc., can be formed along a curvilinear path between adjacent active regions 20. By forming the conductive area 50 in this way, that is, following the curves of the path, it is believed that conductive area 50 will be less subject to stress related failure.

As shown in FIGS. 4, 5, and 6, field oxide 40 formed between two active regions 12 has curvilinear boundaries. This boundary appears to reduce the potential stresses which may be induced in active regions 20. The curving boundary of the field oxide 40 can be formed by 1) forming shields with uneven, stepped, serrated, broken or jagged edges or with curvilinear boundaries on active regions 12; and 2) growing the field oxide by thermally oxidizing the substrate as discussed with respect to the previous embodiment.

While the invention has been described by way of examples and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming a curvilinear field oxide between two active regions on a substrate, which method comprises the following steps:
   (a) forming shields with uneven boundaries on said active regions, said uneven boundaries being patterned along an entire periphery of each of said two active regions; and
   (b) oxidizing said substrate.

2. The method of forming a curvilinear field oxide between two active regions on a substrate as claimed in claim 1 wherein said uneven boundaries are curvilinear.

3. The method of forming a curvilinear field oxide between two active regions on a substrate as claimed in claim 1 wherein said uneven boundaries are stepped or jagged.

4. The method of forming a curvilinear field oxide between two active regions on a substrate as claimed in claim 1, wherein the shields comprise nitrides.

5. A method of forming a curvilinear field oxide between two active regions on a substrate as claimed in claim 1, wherein the shields comprise oxide and nitride.

* * * * *